United States Patent [19]

Kelly et al.

[11] Patent Number: 5,182,530
[45] Date of Patent: Jan. 26, 1993

[54] TRANSVERSAL FILTER FOR PARABOLIC PHASE EQUALIZATION

[75] Inventors: Larry R. Kelly; Geoffrey S. Waugh, both of Palo Alto, Calif.

[73] Assignee: Loral Aerospace Corp., New York, N.Y.

[21] Appl. No.: 639,899

[22] Filed: Jan. 11, 1991

[51] Int. Cl.$^5$ .................. H03G 11/04; H03H 7/38
[52] U.S. Cl. .................. 333/18; 333/28 R; 333/166; 375/11; 375/12; 375/14; 364/824; 364/825
[58] Field of Search .................. 333/18, 28 R, 166; 375/11, 12, 14; 364/824, 825

[56] References Cited

U.S. PATENT DOCUMENTS

| | | | |
|---|---|---|---|
| 3,253,238 | 5/1966 | Woo | 333/28 |
| 3,292,110 | 12/1966 | Becker et al. | 333/18 |
| 3,727,136 | 4/1973 | Schroeder et al. | 325/320 |
| 3,742,360 | 6/1973 | Ragsdale | 333/18 |
| 3,829,798 | 8/1974 | Byram et al. | 333/166 |
| 3,860,892 | 1/1975 | Speiser et al. | 333/166 |
| 4,196,405 | 4/1980 | Le Dily | 333/16 |
| 4,258,340 | 3/1981 | Ryu | 333/18 |
| 4,333,063 | 6/1982 | Ryu et al. | 333/18 |
| 4,422,175 | 12/1983 | Bingham et al. | 333/18 |
| 4,434,438 | 2/1984 | Rzeszewski | 333/18 |
| 4,607,241 | 8/1986 | Horowitz et al. | 333/166 |

OTHER PUBLICATIONS

Ramo, Whinnery and Van Duzer, "Fields and Waves In Communication Electronics", Second Edition, 1984, pp. 396-399.

Primary Examiner—Paul M. Dzierzynski
Assistant Examiner—Michael B. Shingleton
Attorney, Agent, or Firm—John S. Ferrell; Edward J. Radlo

[57] ABSTRACT

An equalizer (10) for removing parabolic phase distortion from an analog signal (3), utilizing a pair of series connected transversal filters. The parabolic phase distortion is cancelled by generating an inverse parabolic approximation using a sinusoidal phase control filter (18). The signal (3) is then passed through an amplitude control filter (21) to remove magnitude ripple components.

2 Claims, 4 Drawing Sheets

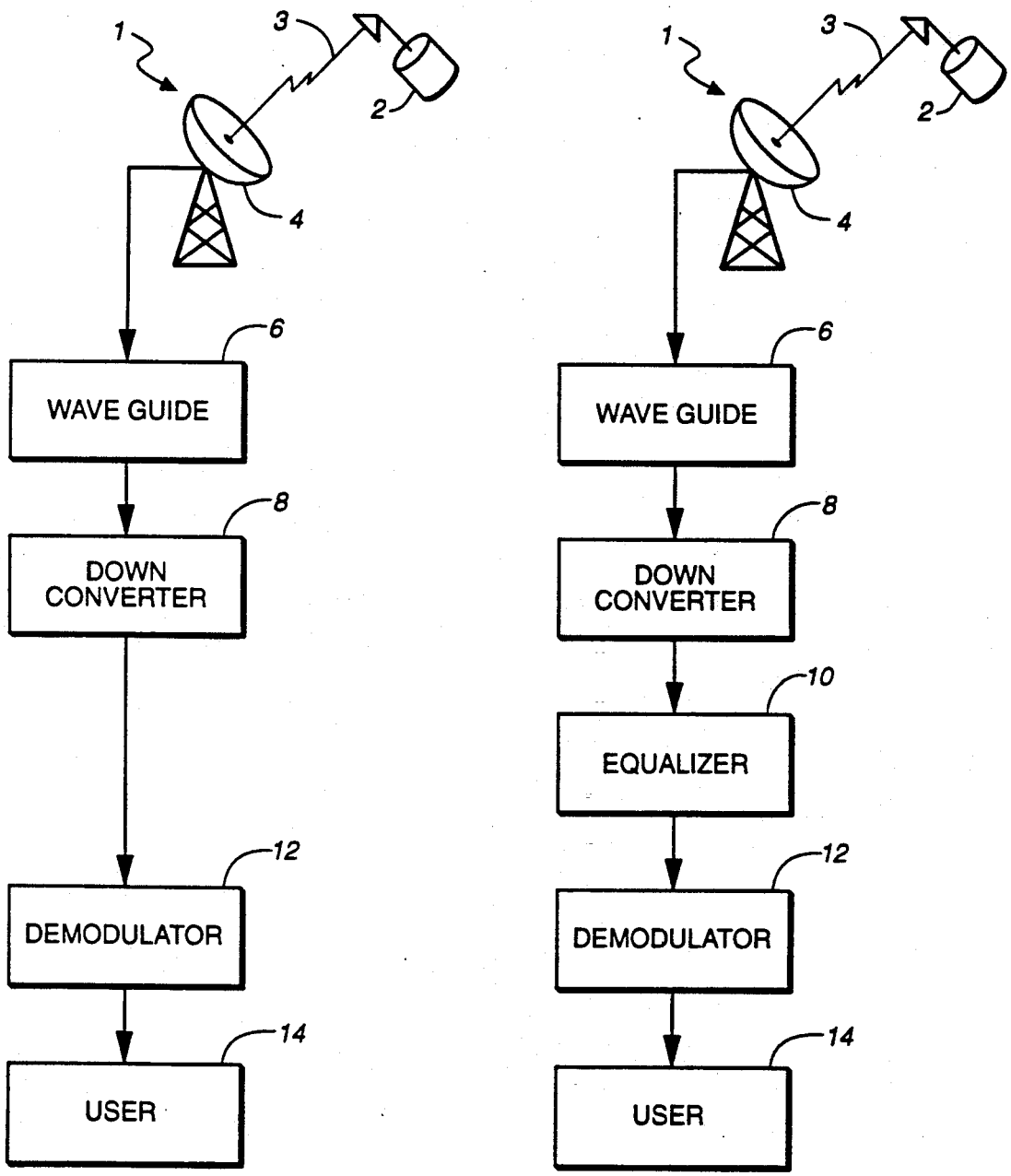
FIG._1
*(PRIOR ART)*
FIG._2

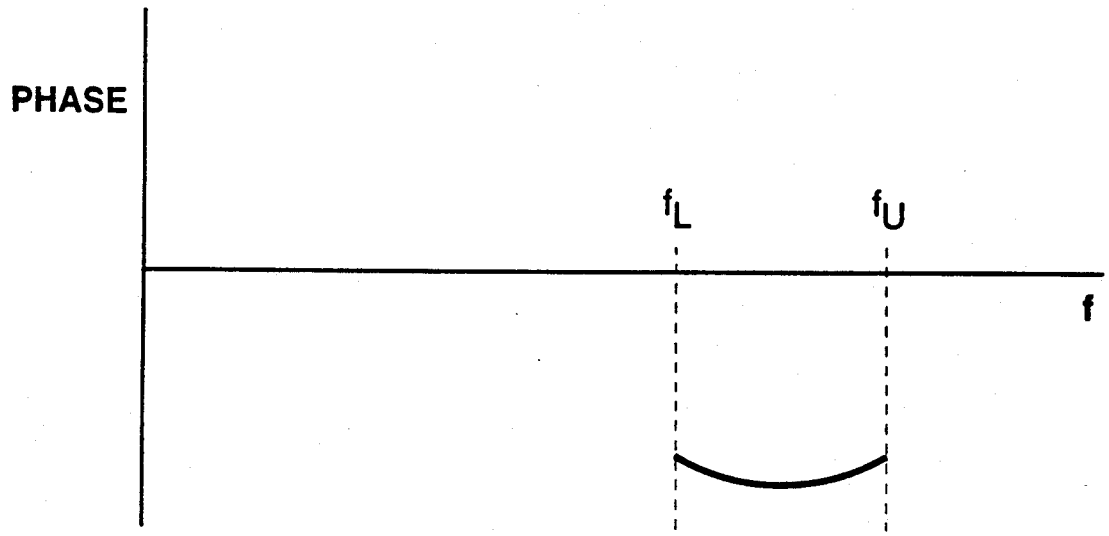
FIG._3
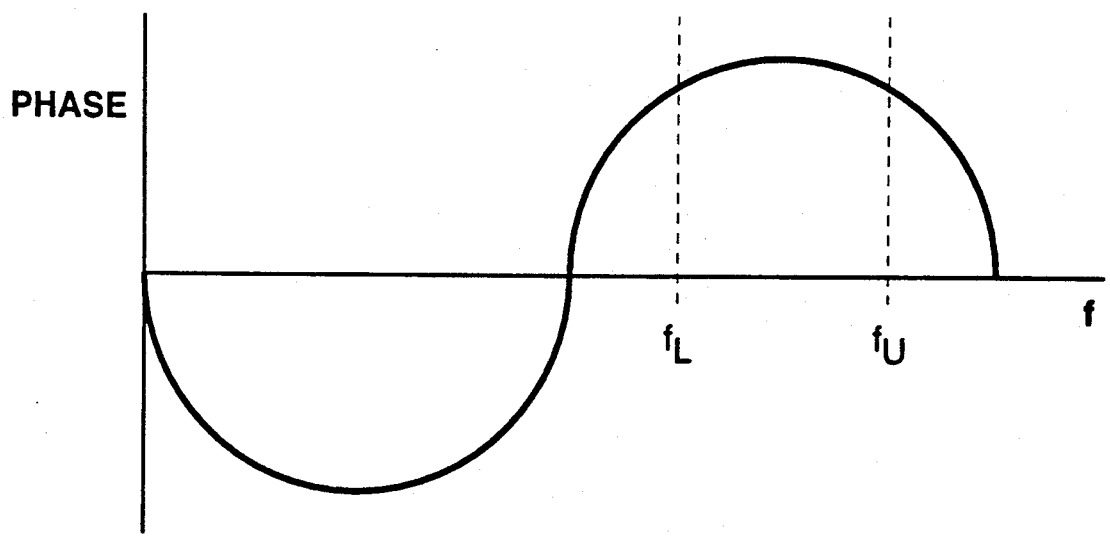
FIG._4

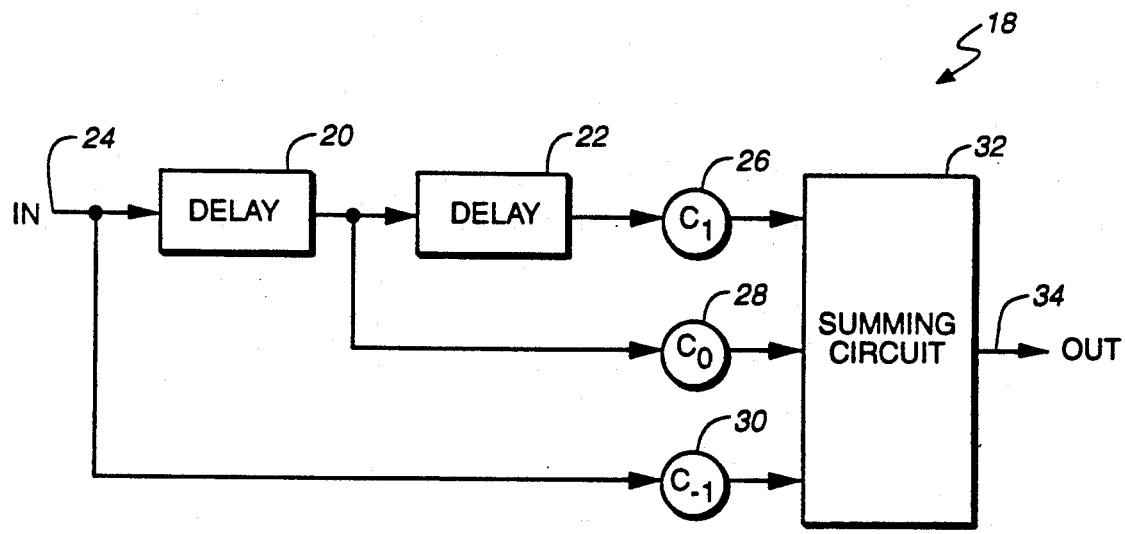
FIG._5
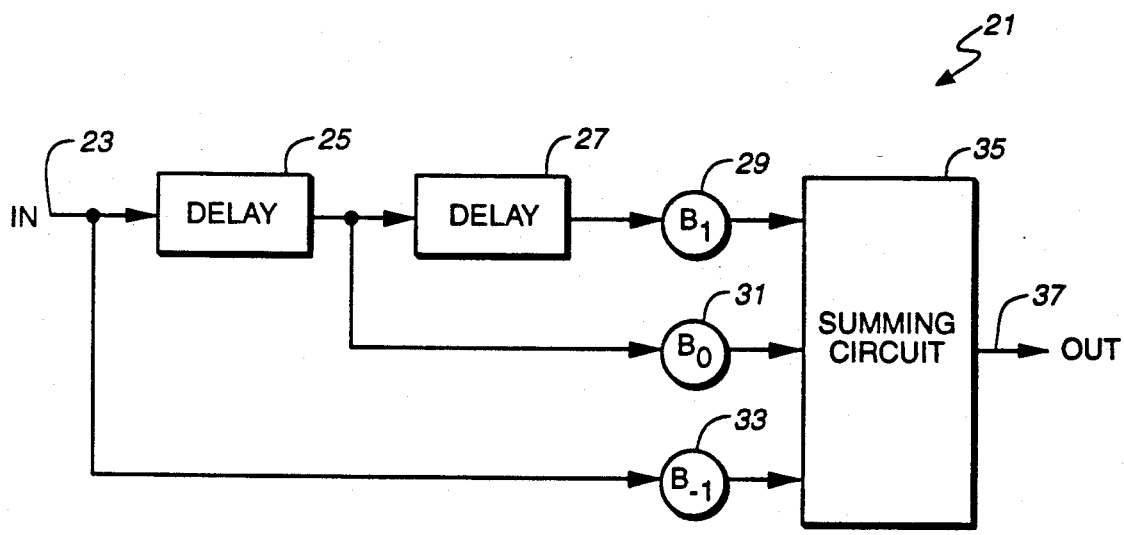
FIG._6
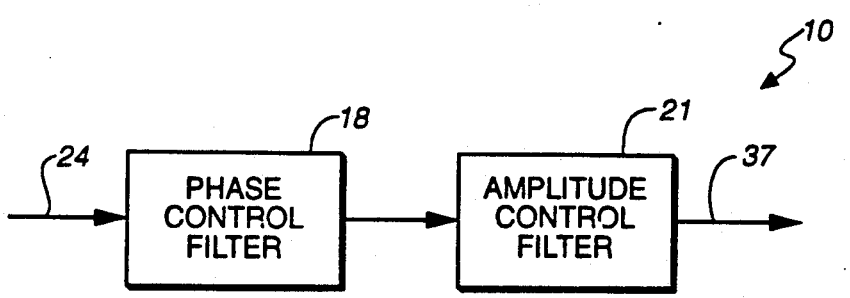
FIG._7

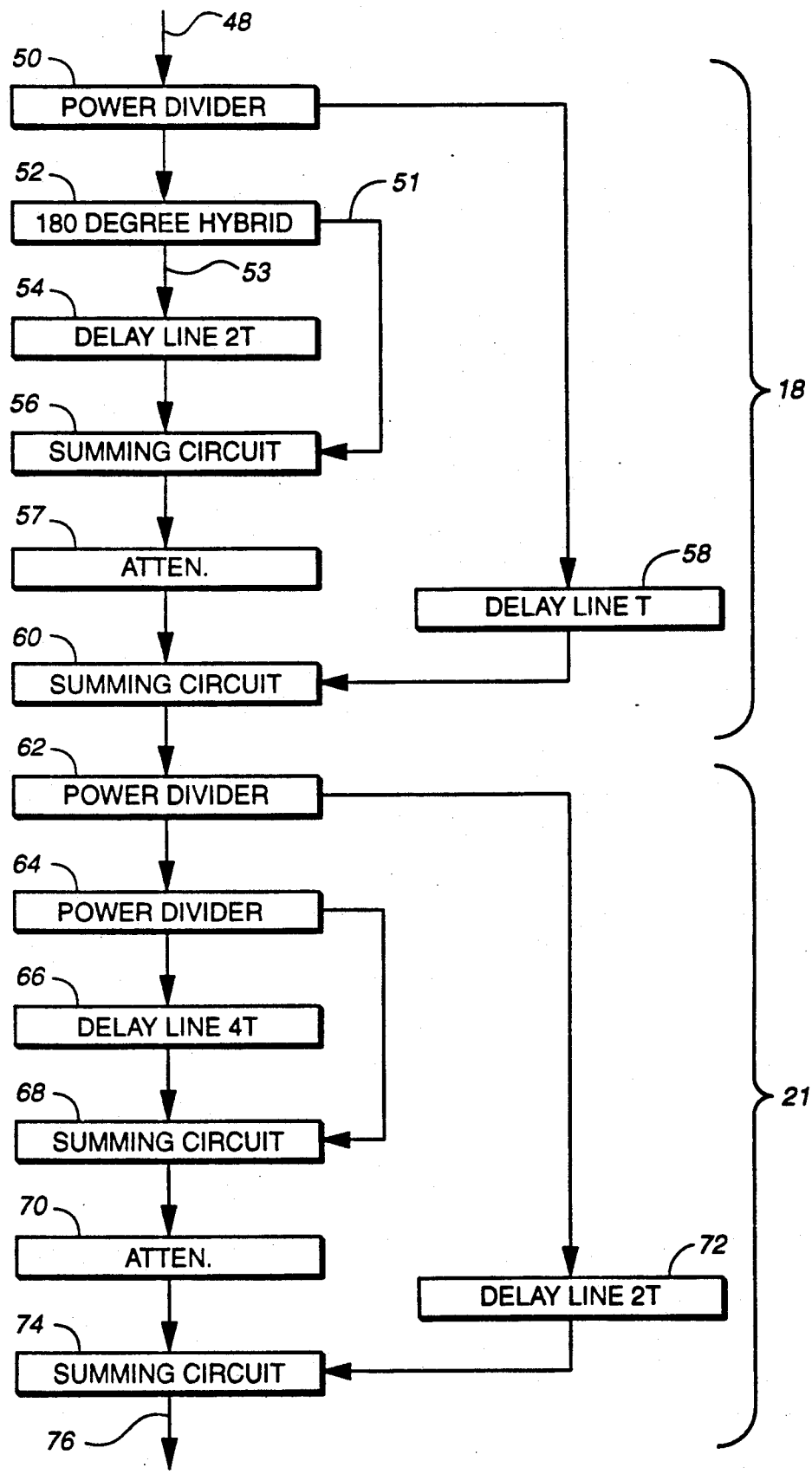
FIG._8

TRANSVERSAL FILTER FOR PARABOLIC PHASE EQUALIZATION

The invention described herein is a subject invention under U.S. government NASA subcontract F1400-J19513, and as such the U.S. government may have rights therein.

BACKGROUND OF THE INVENTION

1. Field of the Invention

This invention relates to analog signal conditioning and more particularly to the removal of parabolic phase distortion from high frequency signals using a pair of series connected transversal filters.

2. Description of the Background Art

In high frequency transmission systems, it is well known that waves of different frequencies do not propagate at the same velocity. (Ramo, Whinnery, and Van Duzer, *Fields and Waves in Communication Electronics*, 2nd ed., 1984, pp. 396-399.) In the transmission of a broadband microwave signal through a waveguide, the higher frequency signals travel at a higher group velocity than the lower frequencies. The staggered arrival of various signal components at a final destination gives rise to group delay distortion. Group delay distortion is defined as the negative change in phase with respect to frequency. Linear group delay corresponds to parabolic phase distortion. This distortion can be corrected using a suitable delay network which slows down the faster components. However, the compensation required varies with frequency, and satisfactory results over a range of frequencies are generally difficult to achieve.

Various approaches to equalizing this so-called "delay distortion" have been proposed. In U.S. Pat. No. 3,253,238, Woo discloses the use of a waveguide containing an internal variable pertubation in the form of a conducting rod mounted at an angle with respect to the waveguide centerline.

A significant improvement in the art of equalization was provided by the development of the transversal filter equalizer, providing a way to compensate for both channel amplitude and phase distortion. U.S. Pat. No. 3,829,798 by Byram et al. discloses an equalizer comprising a series of cascaded transversal filters, each with multiple taps to form an all-pass network.

During a preliminary search of the art related to transversal filters, a number of additional patents were identified which deal primarily with digital filters or analog magnitude filters. These patents are identified as follows:

| | |
|---|---|
| 3,292,110 | Becker et al. |
| 3,727,136 | Schroeder et al. |
| 3,860,892 | Speiser et al. |
| 4,258,340 | Ryu |
| 4,607,241 | Horowitz |
| 4,757,516 | Yoshimoto et al. |

SUMMARY OF THE INVENTION

An equalizer (10) removes parabolic phase distortion from an analog signal (3). The equalizer (10) comprises a first filter means (18) having a sinusoidal phase response which substantially cancels the Parabolic phase distortion, and a series connected second filter means (21) for removing amplitude distortion introduced by the first filter means (18).

BRIEF DESCRIPTION OF THE DRAWINGS

FIG. 1 is a schematic diagram showing various components comprising a prior art satellite communication system 1;

FIG. 2 is a schematic diagram showing various components, including the equalizer of the present invention comprising a satellite communication system 1;

FIG. 3 is a phase response diagram showing a parabolic phase shift component as a function of frequency for a section of conventional high frequency waveguide 6;

FIG. 4 shows the desired filter characteristic for phase shift as function of frequency from a sinusoid required to cancel the parabolic phase shift component shown in FIG. 3;

FIG. 5 shows a theoretical phase control filter 18 schematic diagram of the present invention;

FIG. 6 shows a theoretical amplitude control filter 21 schematic diagram of the present invention;

FIG. 7 shows the interconnect of the phase control filter 18 of FIG. 5 and the amplitude control filter 21 of FIG. 6 to produce the preferred embodiment of the equalizer 10 of the present invention; and FIG. 8 shows a best mode implementation of the equalizer 10 shown in FIG. 7.

BEST MODE FOR CARRYING OUT THE INVENTION

Referring now to FIG. 1, a conventional satellite transmission system 1 is shown, in which a satellite 2 transmits communication signals 3 to a receiving station 4. The receiving station 4 transfers signals 3 to down-converter 8 through waveguide 6. The signal 3 is normally stripped of its carrier frequency in demodulator 12 prior to transfer to user 14.

A by-product of the use of waveguide 6 in high frequency systems is the introduction of frequency dependent Phase distortion. The velocity of high frequency signals varies as a function of frequency. For signals ranging over even a relatively small spectrum of high frequencies, the staggered arrival of differing signal components results in phase distortion which effectively degrades overall signal integrity. For waveguide 6, the phase distortion increases Parabolically with increasing frequency, as shown in FIG. 3. The distortion curve region of interest lies between the lower frequency ($f_L$) and upper frequency ($f_U$) points. (See FIG. 3). The present invention is directed toward filtering signal 3 using equalizer 10 (see FIG. 2), to linearize the parabolic phase response and thus compensate for the distortion introduced by waveguide 6. By approximating the inverse of the parabolic phase distortion using half-wave components of a sinusoid as shown in FIG. 4, a filter can be constructed for canceling the parabolic distortion. The region of the curve in FIG. 4 which lies between points $f_L$ and $f_U$ is chosen to approximate the inverse of the corresponding parabolic region in FIG. 3. The shape of the sinusoid between $f_L$ and $f_U$ can be changed by changing the frequency and/or amplitude of the sinusoid function.

A useful starting point in describing the practice of the present invention is Euler's theorem, which is traditionally written as:

$$COS\theta + j SIN\theta = e^{j\theta}, \text{ and}$$

$$COS\theta - j SIN\theta = e^{-j\theta} \qquad (1)$$

where $j = \sqrt{-1}$

From this theorem comes the familiar identity:

$$\text{SIN } \theta = \frac{e^{j\theta} - e^{-j\theta}}{2j} \quad (2)$$

In order to realize a sinusoidal phase response function, the general circuit of FIG. 5 is constructed having the following general time domain response:

$$h(t) = C_{-1}\delta(t) + C_0\delta(t - Td) + C_1\delta(t - 2Td) \quad (3)$$

where the Dirac delta function $$\delta(t) = 1 \text{ for } t = 0, \text{ and}$$
$$\delta(t) = 0 \text{ for } t \neq 0. \quad (4)$$

The Fourier transform of the time domain response of (3) produces $$H(j\omega) = C_{-1} + C_0 e^{-j\omega Td} + C_1 e^{-j\omega 2Td} \quad (5)$$

By applying the Euler's identity of Eq. 2 to Eq. 5 and setting $C_{-1}$ equal to $-C_1$, the transfer function resolves to:

$$H(j\omega) = e^{-j\omega Td}[C_0 - 2jC_1 \text{ SIN}(\omega Td)] \quad (6)$$

The magnitude of the transfer function is $$|H(j\omega)| = (C_0^2 + 4C_1^2 \text{ SIN}^2 \omega Td)^{\frac{1}{2}} \quad (7)$$

The phase response is $$\text{phase }\{H(j\omega)\} = \text{TAN}^{-1} \frac{-2C_1 \text{ SIN}(\omega Td)}{C_0} \quad (8)$$

Note that the phase response is sinusoidal in characteristic.

Incidental to the filtering effect produced by the parabolic equalizer is the introduction of sinusoidal ripple as shown in the magnitude response:

$$|H(j\omega)|^2 = C_0^2 + 4C_1^2 \text{ SIN}^2 \omega Td \quad (9)$$

This magnitude is characterized by the constant term:

$$\text{constant }\{|H(j\omega)|^2\} = C_0^2 \quad (10)$$

and the sinusoidal term:

$$\text{sinusoidal}\{|H(j\omega)|^2\} = 4C_1^2 \text{ SIN}^2 \omega Td \quad (11)$$

Removal of this sinusoidal term can be easily effected using a second filter stage 21 similar to the three tap transversal 18 used to filter the phase, as shown in FIG. 6. The time-domain transfer function can be expressed:

$$h(t) = B_{-1}\delta(t) + B_0\delta(t - 2T) + B_1\delta(t - 4T) \quad (12)$$

Taking the Fourier transform of this time domain expression yields:

$$H(j\omega) = B_{-1} + B_0 e^{-j\omega 2T} + B_1 e^{-j\omega 4T} \quad (13)$$

Applying Euler's equation:

$$\text{COS } 2\omega T = \frac{e^{j2\omega T} + e^{-j2\omega T}}{2} \quad (14)$$

and setting $B_1$ equal to $B_{-1}$, yields:

$$H(j\omega) = e^{-j2\omega T}[B_0 + 2B_1 \text{ COS } 2\omega T] \quad (15)$$

The static delay term in front of the brackets can be ignored, since it has no impact on the amplitude and produces a linear phase response. Remaining now are the sinusoidal and constant terms similar to those of Eq. 9. Through Fourier convolution of the two filter stages 18, 21 it can be shown that by following the first phase equalizer stage 18 with a second amplitude smoothing stage 21, parabolic distortion can be largely eliminated, leaving only very low order amplitude components. The series interconnect of the two stages 18, 21 is shown in FIG. 7.

Implementation of the topologies derived above can be approached in several ways using a number of different circuit components. The preferred embodiment of the present invention is shown in FIG. 8. As shown in FIG. 7, equalizer 10 comprises two sections, phase control filter 18 and amplitude control filter 21 connected in series. The equalizer 10 input 48 is also the input to power divider 50, which equally splits the incoming signal between the input of 180 degree hybrid 52 and the input of delay line 58. Hybrid 52 is a conventional hybrid having a noninverting output 53 and an inverting output 51. Noninverting output 53 connects to the input of delay line 54. Delay line 54 is implemented using an appropriate length of coaxial cable to produce a time delay of 2T. Delay line output 54 feeds the first input to dual input summing circuit 56, and the second input of summing circuit 56 is coupled to the inverting output 51 of hybrid 52. The output of summing circuit 56 is coupled to the input of conventional attenuator 57. The attenuated signal is then combined with the output of delay line 58 in summing circuit 60. The output of summing circuit 60 is the output signal for Phase control filter 18. Changing the amount of attenuation in attenuator 57 provides a simple method for adjusting the amount of parabolic phase compensation achieved.

The output from summing circuit 60 feeds into amplitude control filter 21, which has power divider 62 as its input device. Power divider 62 sends one half of its signal to power divider 64 and the other half to delay line 72. Power divider 64 is identical to divider 62 and splits signals between delay line 66 and summing circuit 68. Delay line 66 is constructed using a length of coaxial cable of appropriate length to produce a signal delay of period 4T. The output of delay line 66 feeds a second input to summing circuit 68. The output of summing circuit 68 connects to the input of conventional attenuator 70, which in turn feeds a first input of summing circuit 74. A second input to summing circuit 74 is provided by the output of delay line 72. Delay line 72 is characterized by a time delay of period 2T. The output of summing circuit 74 provides the output signal for amplitude control filter 21 as well as for equalizer 18. Amplitude response filtering can be easily adjusted by varying the attenuation of attenuator 70.

EXAMPLE

An example of implementation of the preferred embodiment shown in FIG. 8 was constructed to equalize an IF signal having a center frequency of 370 MHz. Power dividers 50, 62 and 64; hybrid 52; summing circuits 56, 60, 68 and 74; and attenuators 57 and 70 were all commercially purchased, standardized components. Attenuator 57 was set to a value of 14 dB. Attenuator 70 was set to a value of 28 dB. The delay lines were constructed using coaxial cable lengths calculated to produce a delay of T=2.03 nS. Using RG-316 cable, a delay of T was produced by a length of approximately 17 inches. Using these component parameters, a parabolic phase equalization of 22 degrees over a 240 MHz bandwidth was obtained.

The present invention has now been explained with reference to specific embodiments and frequency ranges. Other embodiments will be apparent to those of ordinary skill in the art in light of this disclosure. It will also be apparent that this technique is applicable from several Hertz to hundreds of gigahertz, limited only by the feasibility of substituting appropriate circuit elements for the frequency range of interest. Therefore, it is not intended that this invention be limited, except as indicated by the appended claims.

We claim:

1. An equalizer operating in the frequency domain for removing parabolic phase distortion from an analog signal, the equalizer comprising:

first analog filter means having a sinusoidal phase response which substantially cancels the parabolic phase distortion, wherein the first filter means has an input coupled to the analog signal and output, and wherein the first filter means is a three tap transversal filter further comprising:

an equao-output power divider having an input and first and second outputs, wherein the input of the power divider is the input of the transversal filter;

a 180 degree hybrid power divider having an input, a noninverting output, and an inverting output, wherein the input of the hybrid power divider is coupled to the first output of the equal-output power divider;

a first delay line having a delay period of T, an input, and an output, wherein the input of the first delay line is coupled to the second output of the equal-output power divider;

a second delay line having a delay period of 2T, an input, and an output, wherein the input of the second delay line is coupled to the noninverting output of the hybrid power divider;

a first summing circuit having first and second inputs and an output, wherein the first input of the first summing circuit is coupled to the output of the second delay line and the second input of the first summing circuit is coupled to the inverting output of the hybrid power divider;

an attenuator for controlling phase having an input and an output, wherein the input of the attenuator is coupled to the output of the first summing circuit; and a second summing circuit having first and second inputs and an output, wherein the first input of the second summing circuit is coupled to the attenuator output, and the second input of the second summing circuit is coupled to the output of the first delay line, and the output of the second summing circuit is the output of the transversal filter; and second analog filter means for removing amplitude distortion introduced by the first filter means, wherein the second filter means has an input coupled to the output of the first filter means.

2. An equalizer operating int eh frequency domain for removing parabolic distortion from an analog signal, the equalizer comprising:

first analog filter means having a sinusoidal phase response which substantially cancels the parabolic phase distortion wherein the first filter means has an input coupled to the analog signal and output; and second analog filter mean for removing amplitude distortion introduced by the first filter means, wherein the second filter means has an input coupled to the output of the first filter means, and wherein the second filter means is a three tap transversal filter comprising:

a first power divider having an input and first and second outputs, wherein the input of the first power divider is the input of the transversal filter;

a second power divider having an input and first and second outputs, wherein the input of the second power divider is coupled to the first output of the first power divider;

a first delay line having a delay period of 4T, an input, and an output, wherein the input of the first delay line is coupled to the first output of the second power divider;

a second delay line having a delay period of 2T, an input, and an output, wherein the input of the second delay line is coupled to the second output of the first power divider;

a first summing circuit having first and second inputs and an output, wherein the first input of the first summing circuit is coupled to the output of the first delay line and the second input of the first summing circuit is coupled to the second output of the second power divider;

an attenuator for controlling amplitude having an input and an output, wherein the input of the attenuator is coupled to the output of the first summing circuit; and a second summing circuit having first and second inputs and an output, wherein the first input of the second summing circuit is coupled to the attenuator output, the second input of the second summing circuit is coupled to the output of the second delay line, and the output of the second summing circuit is the output of the transversal filter.

* * * * *